(12) United States Patent
Fukuda et al.

(10) Patent No.: US 12,308,301 B2
(45) Date of Patent: May 20, 2025

(54) STRUCTURE AND BONDED BODY

(71) Applicant: KABUSHIKI KAISHA TOSHIBA, Tokyo (JP)

(72) Inventors: Yumi Fukuda, Setagaya (JP); Koichi Harada, Bunkyo (JP); Kenji Essaki, Kawasaki (JP); Yasushi Hattori, Kawasaki (JP); Yasuhiro Goto, Minato (JP); Keiko Albessard, Yokohama (JP); Maki Yonetsu, Mitaka (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 162 days.

(21) Appl. No.: 17/176,399

(22) Filed: Feb. 16, 2021

(65) Prior Publication Data
US 2021/0166989 A1      Jun. 3, 2021

Related U.S. Application Data

(63) Continuation of application No. PCT/JP2020/009944, filed on Mar. 9, 2020.

(30) Foreign Application Priority Data

Sep. 17, 2019   (JP) ................................ 2019-168557

(51) Int. Cl.
*H01L 23/373*      (2006.01)
*C04B 35/597*     (2006.01)

(52) U.S. Cl.
CPC ........ *H01L 23/3735* (2013.01); *C04B 35/597* (2013.01); *C04B 2235/3873* (2013.01)

(58) Field of Classification Search
CPC ............... H01L 23/3735; C04B 35/597; C04B 2235/3873
See application file for complete search history.

(56) References Cited

U.S. PATENT DOCUMENTS

| 5,928,601 A | 7/1999 | Miyake et al. | |
|---|---|---|---|
| 2011/0176277 A1* | 7/2011 | Kaga | H05K 1/0306 264/650 |
| 2016/0251223 A1* | 9/2016 | Nakayama | H01L 23/3735 428/209 |

FOREIGN PATENT DOCUMENTS

| EP | 2 301 906 A1 | 3/2011 |
|---|---|---|
| JP | 51-59910 | 5/1976 |

(Continued)

OTHER PUBLICATIONS

International Search Report issued May 19, 2020 in PCT/JP2020/009944 filed Mar. 9, 2020, 5 pages.

(Continued)

*Primary Examiner* — Jay C Kim
*Assistant Examiner* — Woo K Lee
(74) *Attorney, Agent, or Firm* — Oblon, McClelland, Maier & Neustadt, L.L.P.

(57) ABSTRACT

According to one embodiment, a structure according to the embodiment includes a β type silicon nitride type crystal phase and a $Y_2Si_3O_3N_4$ type crystal phase. In an X-ray diffraction pattern according to a θ-2θ method of the structure, a ratio of a second peak intensity being maximum and appearing at 2θ=31.93±0.1° with respect to a first peak intensity being maximum and appearing at 2θ=27.03±0.1° is 0.005 or more and 0.20 or less.

20 Claims, 6 Drawing Sheets

(56) References Cited

FOREIGN PATENT DOCUMENTS

| | | |
|---|---|---|
| JP | 56-59674 A | 5/1981 |
| JP | 59-131579 A | 7/1984 |
| JP | 2-59472 A | 2/1990 |
| JP | 6-345535 A | 12/1994 |
| JP | 9-69672 A | 3/1997 |
| JP | 11-100274 A | 4/1999 |
| JP | WO2010/002001 A1 | 1/2010 |
| JP | 2011-195395 A | 10/2011 |
| JP | WO2014/119522 A1 | 8/2014 |
| JP | 2018-184333 A | 11/2018 |
| WO | WO 2017/014168 A1 | 1/2017 |
| WO | WO 2017/014169 A1 | 1/2017 |

OTHER PUBLICATIONS

Written Opinion issued May 19, 2020 in PCT/JP2020/009944 filed Mar. 9, 2020, 7 pages.
Zhou, Y. et al., "Effects of yttria and magnesia on densification and thermal conductivity of sintered reaction-bonded silicon nitrides," Journal of the American Ceramic Society, vol. 102, 2019, 10 pages.
Park et al., "Effects of Debinding Atmosphere on Properties of Sintered Reaction-bonded $Si_3N_4$ Prepared by Tape Casting Method", Journal of the Korean Ceramic Society, Nov. 2016, vol. 53, No. 6, pp. 622-627.

\* cited by examiner

STRUCTURE AND BONDED BODY

CROSS-REFERENCE TO RELATED APPLICATIONS

This is a continuation application of International Patent Application PCT/JP2020/009944, filed on Mar. 9, 2020. This application also claims priority to Japanese Patent Application 2019-168557, filed on Sep. 17, 2019. The entire contents of which are incorporated herein by reference.

FIELD

Embodiments described herein relate generally to a structure and a bonded body.

BACKGROUND

There is a structure including silicon nitride. It is desired that thermal conductivity or flexural strength of the structure is high.

DETAILED DESCRIPTION

According to one embodiment, a structure according to the embodiment includes a β type silicon nitride type crystal phase and a $Y_2Si_3O_3N_4$ type crystal phase. In an X-ray diffraction pattern according to a θ-2θ method of the structure, a ratio of a second peak intensity being maximum and appearing at 2θ=31.93±0.1° with respect to a first peak intensity being maximum and appearing at 2θ=27.03±0.1° is 0.005 or more and 0.20 or less.

The embodiment of the invention will now be described with reference to the drawings.

Figure 1:
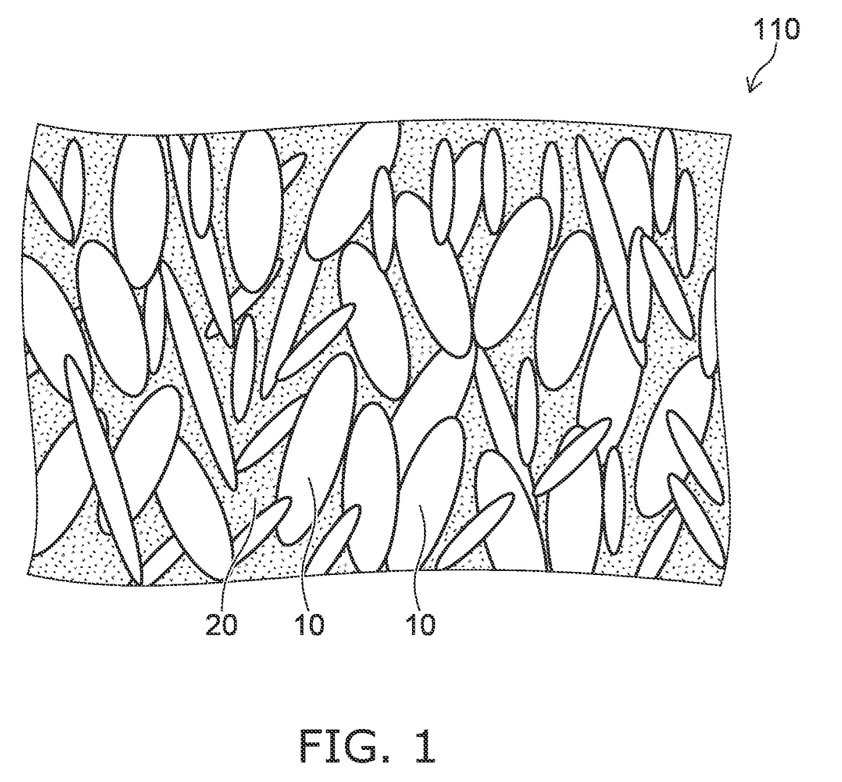
FIG. 1 is a schematic cross-sectional view illustrating a structure according to an embodiment.

FIG. 1 is a schematic cross-sectional view illustrating the structure according to the embodiment.

A structure 110 according to the embodiment includes crystal grains 10 and grain boundaries 20 provided around the crystal grains 10, as illustrated in FIG. 1 a plurality of crystal grains 10 exist in the grain boundary 20. The plurality of crystal grains 10 in the grain boundary 20 may be spaced from each other or may partially contact each other. A part of the plurality of crystal grains 10 may be separated from each other, and another part of the plurality of crystal grains 10 may partially contact each other.

The crystal grain 10 includes a β type silicon nitride type crystal phase. The grain boundary 20 includes yttrium, silicon, oxygen, and nitrogen. For example, the grain boundary 20 includes a $Y_2Si_3O_3N_4$ type crystal phase. The $Y_2Si_3O_3N_4$ Type crystal refers to a crystal having the same crystalline structure as that of $Y_2Si_3O_3N_4$. Here, the same crystalline structure means that a crystal system, a space group, and a positional relationship of constituent atoms are the same, and an interatomic distance or a lattice constant may not necessarily be equal. Also, an element included in the crystalline phase does not matter. That is, a composition of the $Y_2Si_3O_3N_4$ type crystal phase may be different from that of $Y_2Si_3O_3N_4$.

Figure 2:
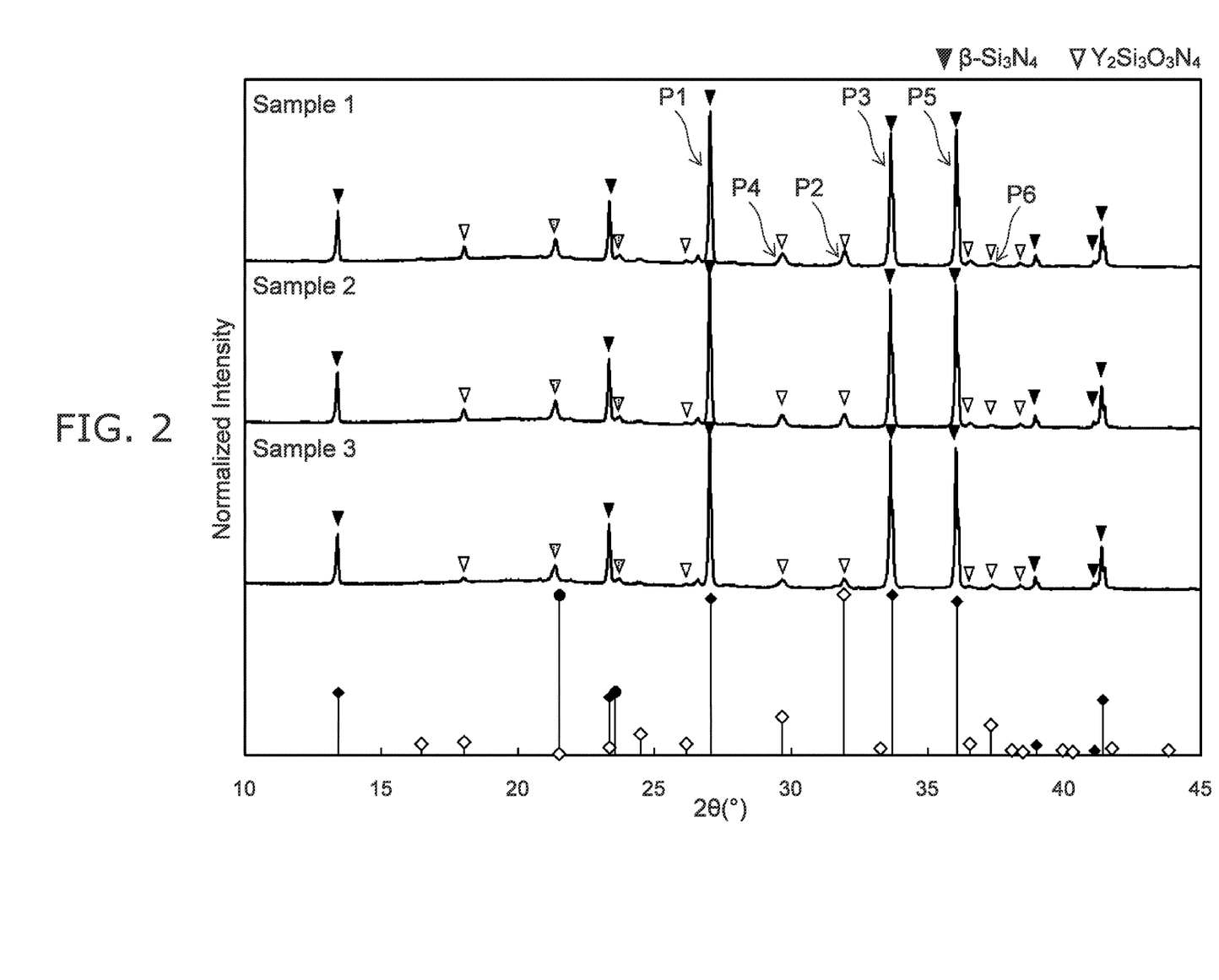
FIG. 2 is graphs illustrating analysis results of the structure according to the embodiment.

FIG. 2 is graphs illustrating analysis results of the structure according to the embodiment.

FIG. 2 illustrates an X-ray diffraction pattern according to the θ-2θ method of the structure according to the embodiment. The horizontal axis represents 2θ. The vertical axis represents a normalized intensity.

Conditions in measuring the X-ray diffraction pattern are set as follows, for example. X-ray diffraction according to a concentration method (reflection method, Bragg-Brendano method) is performed using an X-ray diffraction apparatus, for example, Smart-Lab (manufactured by Rigaku Corporation). In the X-ray diffraction, any cross-section of the structure is taken as a measurement surface. The measurement surface is polished such that a surface roughness Ra is 0.05 μm or less. A Cu target (Cu—Kα) is used for the measurement. A tube voltage is set to 45 kV. A tube current is set to 200 mA. A scanning speed is set to 2.0 to 20.0°/min. An incident parallel slit is set to 5 degrees, a longitudinal restriction slit is 10 mm, a light receiving slit is set to 20 mm, and a light receiving parallel slit is set to 5 degrees. A scanning range (2θ) is set to 10° to 80° and the measurement is performed in increments of 0.01°.

In FIG. 2, each of the top three graphs indicates the corresponding analysis result for samples 1 to 3. In the analysis results, a peak pointed with a black triangular arrow (▼) is attributed to the β type silicon nitride type crystal phase. A peak pointed with a white triangular arrow (▽) is attributed to the $Y_2Si_3O_3N_4$ type crystal phase. A peak pointed with a triangular arrow with dots is attributed to a jig used in the measurement.

The graph on the bottom (right of the page) illustrates diffraction patterns of the β type silicon nitride ($β-Si_3N_4$) type crystal phase, the $Y_2Si_3O_3N_4$ type crystal phase, and a material of the jig. A line with a black diamond shape (◆) indicates an angle at which a peak of the β type silicon nitride type crystal phase appears. A line with a white diamond shape (◇) indicates an angle at which a peak of the $Y_2Si_3O_3N_4$ type crystal phase appears. A line with a black circle (●) indicates an angle at which a peak attributed to the jig appears. Here, a pattern included in Powder Diffraction File provided by International Centre for Diffraction Data (trademark) is used.

The samples 1 to 3 are manufactured by the same method under the same conditions as one another. As illustrated in FIG. 2, with the structure according to the embodiment, a peak P1 appears at 27.03±0.1° for the β type silicon nitride type crystal phase. A peak P2 appears at 31.93±0.1° for the $Y_2Si_3O_3N_4$ type crystal phase.

For the sample 1, a ratio of the second peak intensity being maximum and appearing at 31.93±0.1° with respect to the first peak intensity being maximum and appearing at 27.03±0.1° is 0.13. For the sample 2, a ratio of the second peak intensity with respect to the first peak intensity is 0.12. For the sample 3, a ratio of the second peak intensity with respect to the first peak intensity is 0.10. This is because an abundance ratio of the $Y_2Si_3O_3N_4$ type crystal phase with respect to the β type silicon nitride ($β-Si_3N_4$) type crystal phase is relatively low.

When a plurality of peaks appear at 27.03±0.1° or 31.93±0.1°, the ratio is calculated using a peak having the highest intensity. Hereinafter, when a plurality of peaks appear within a specific range of angles, each ratio to be described below is calculated using a peak with the highest intensity.

A peak P3 also appears at 33.63±0.1° for the β type silicon nitride type crystal phase. A peak P4 appears at 29.67±0.1° for the $Y_2Si_3O_3N_4$ type crystal phase.

For sample 1, a ratio of a fourth peak intensity being maximum and appearing at 29.67±0.1° with respect to a third peak intensity being maximum and appearing at 33.63±0.1° is 0.14. For sample 2, a ratio of a fourth peak intensity with respect to a third peak intensity is 0.12. For sample 3, a ratio of a fourth peak intensity with respect to a third peak intensity is 0.09.

Furthermore, a peak P5 also appears at 36.04±0.1° for the β type silicon nitride type crystal phase. A peak P6 also appears at 38.36±0.1° for the $Y_2Si_3O_3N_4$ type crystal phase.

For sample 1, a ratio of a sixth peak intensity being maximum and appearing at 38.36±0.1° with respect to a fifth peak intensity being maximum and appearing at 36.04±0.1° is 0.07. For sample 2, a ratio of a sixth peak intensity with respect to a fifth peak intensity is 0.07. For sample 3, a ratio of a sixth peak intensity with respect to a fifth peak intensity is 0.07.

Next, a method of manufacturing the structure according to the embodiment will be described.

Si of 100 mol % expressed in terms of $Si_3N_4$, $Y_2O_3$ of 2 mol %, and MgO of 5 mol % are weighed. $Y_2O_3$ and MgO are used as auxiliary agents. In addition, $B_2O_3$ may be used as the auxiliary agent, and each of these auxiliary agents may be used alone, or a plurality of the auxiliary agents may be mixed and used. A percentage of the auxiliary agents is favorably not lower than 2 mol % and not higher than 20 mol % expressed in terms of $Si_3N_4$.

These materials are ground and mixed by using a planetary ball mill for not shorter than 0.2 hours and not longer than 6 hours. When the grinding time is too short, grain diameters of the materials are too large, and strength of the structure decreases, which is not favorable. When the grinding time is too long, the grain diameters of the materials become too small, and thermal conductivity decreases, which is not favorable.

Next, granulation is performed by drying the mixture and adding a binder. At this time, polyvinyl butyl alcohol, acrylic resin, or the like may be used as the binder. These binders may be used alone or a plurality of different binders may be mixed. Not less than 1 wt % and not more than 20 wt % of the binder with respect to the total amount is favorably added. When the binder is less than 1 wt %, the materials are hardly bound to each other, and the strength of the structure decreases, which is not favorable. When the binder is larger than 20 wt %, an amount of the binder in the structure becomes too large, and the thermal conductivity of the structure decreases, which is not favorable.

Thereafter, by applying a pressure of not lower than 0.5 t/cm$^2$ and not higher than 10 t/cm$^2$, molding is performed. The pressure is adjusted depending on the materials. A molded body is degreased in the air at a temperature of not lower than 300° C. and not higher than 800° C., and then is processed in a nitrogen atmosphere at not lower than 1000° C. and not higher than 1500° C. The processing time for the degreasing and the processing time at the nitrogen atmosphere are adjusted depending on the processing temperature.

Thereafter, the structure according to the embodiment may be obtained by sintering for not shorter than 1 hour and not longer than 200 hours at a temperature of not lower than 1700° C. and not higher than 2100° C.

An example of the method of manufacturing the structure according to the embodiment will be described. The example is a method of manufacturing the sample 1.

Si of 100 mol % expressed in terms of $Si_3N_4$, $Y_2O_3$ of 2 mol %, and MgO of 5 mol % are weighed. $Y_2O_3$ and MgO are used as auxiliary agents. These materials are ground and mixed for 1 hour by using a planetary ball mill. The granulation is performed by drying the mixture and adding 5 wt % of polyvinyl butyl alcohol as a binder. Then, by adding a pressure of 1 t/cm$^2$, molding is performed. A molded body is degreased in the air at 500° C. and then is processed for 8 hours at 1400° C. in a nitrogen atmosphere. Sintering is then performed at 1900° C. for 24 hours to fabricate a sintered body. Thus, the structure according to the embodiment may be obtained.

In manufacturing of the sample 2, mixing time of raw materials is different from that of manufacturing of the sample 1. In manufacturing of the sample 3, a ratio of auxiliary agents is different from that of the manufacturing of the sample 1. The samples 2 and 3 were fabricated in the same manner as sample 1, except for these points.

Figure 3:
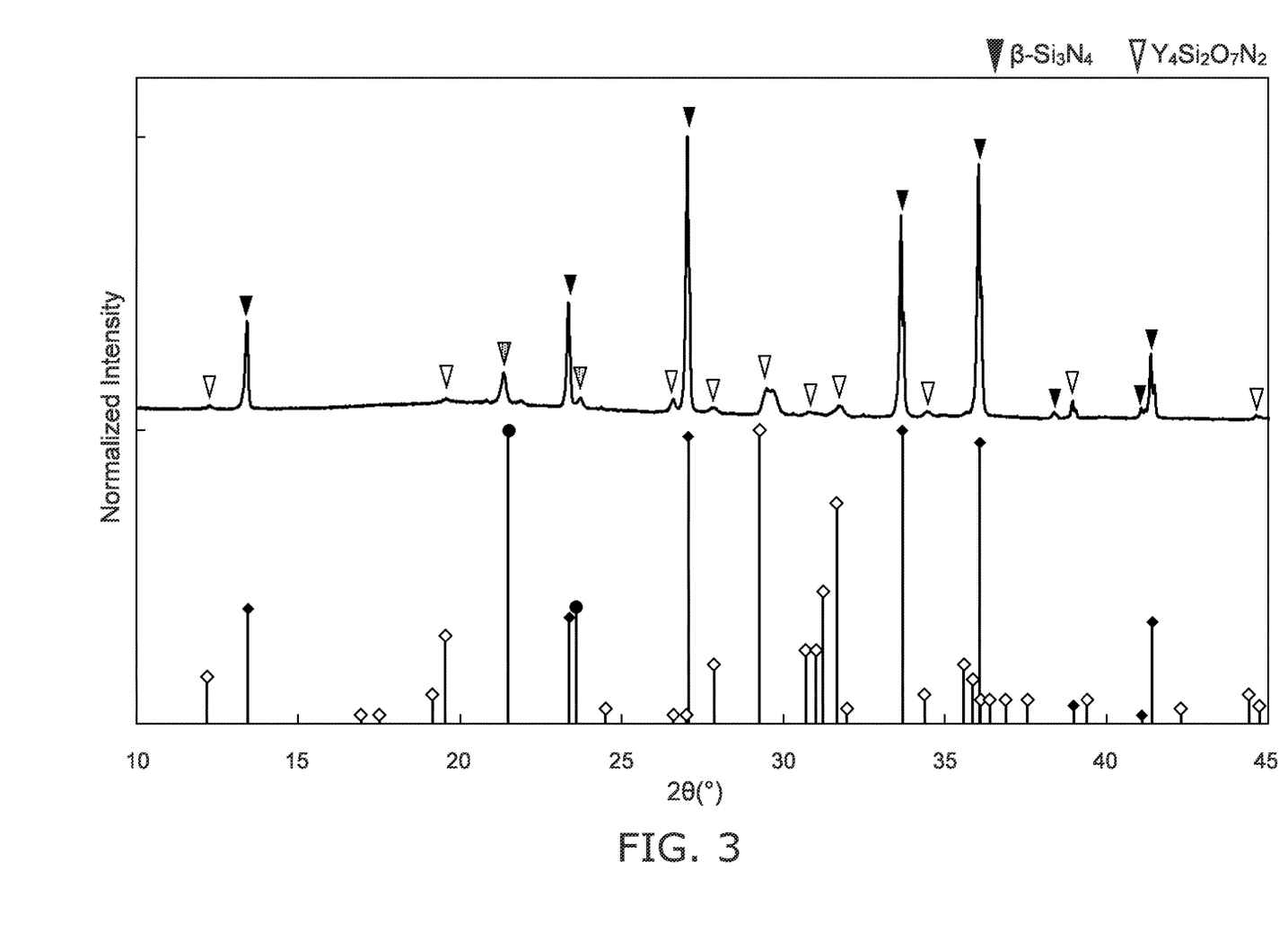
FIG. 3 is a graph illustrating analysis results of a structure according to a reference example.
Figure 4:
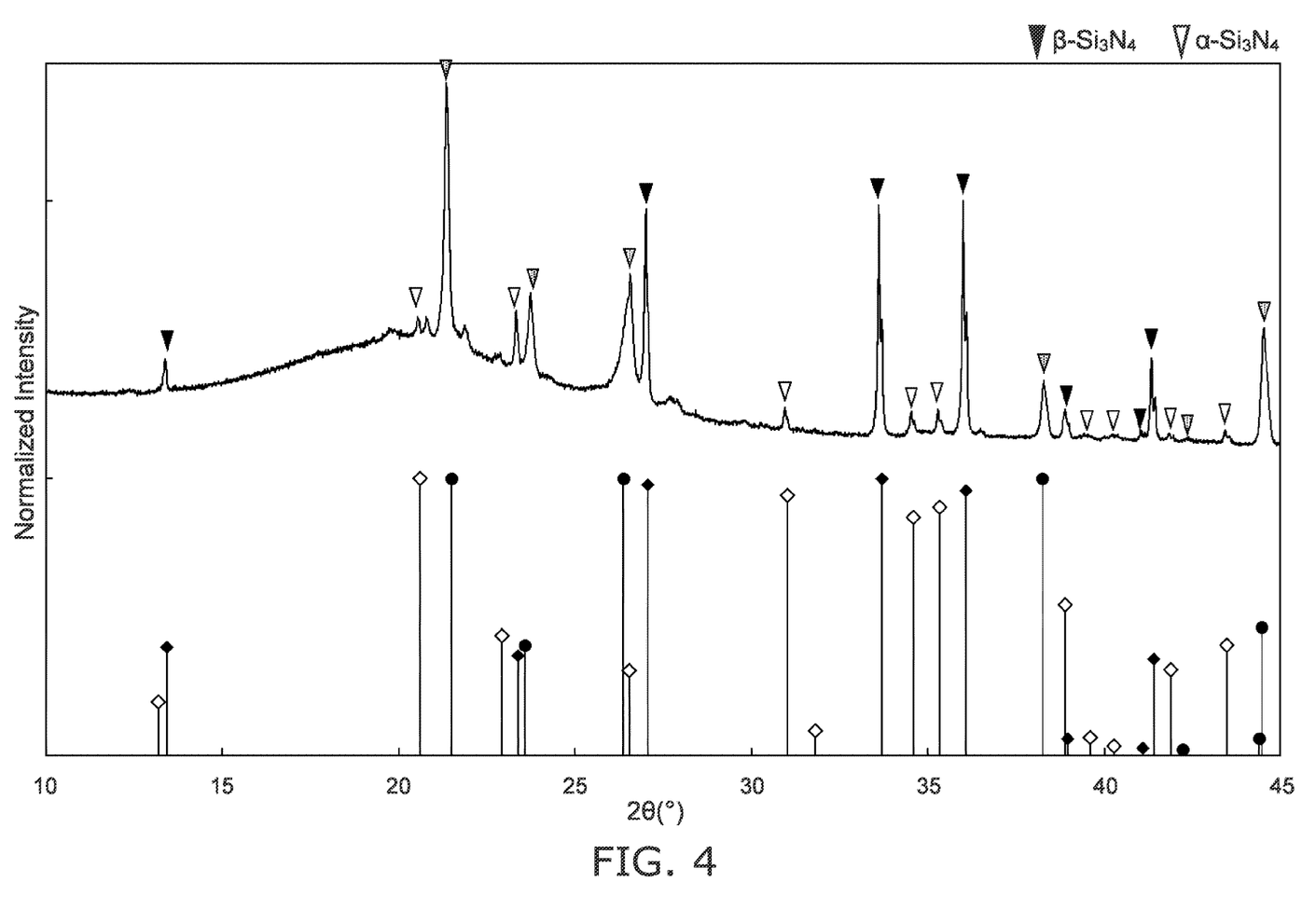
FIG. 4 is a graph illustrating analysis results of a structure according to a reference example.
Figure 5:
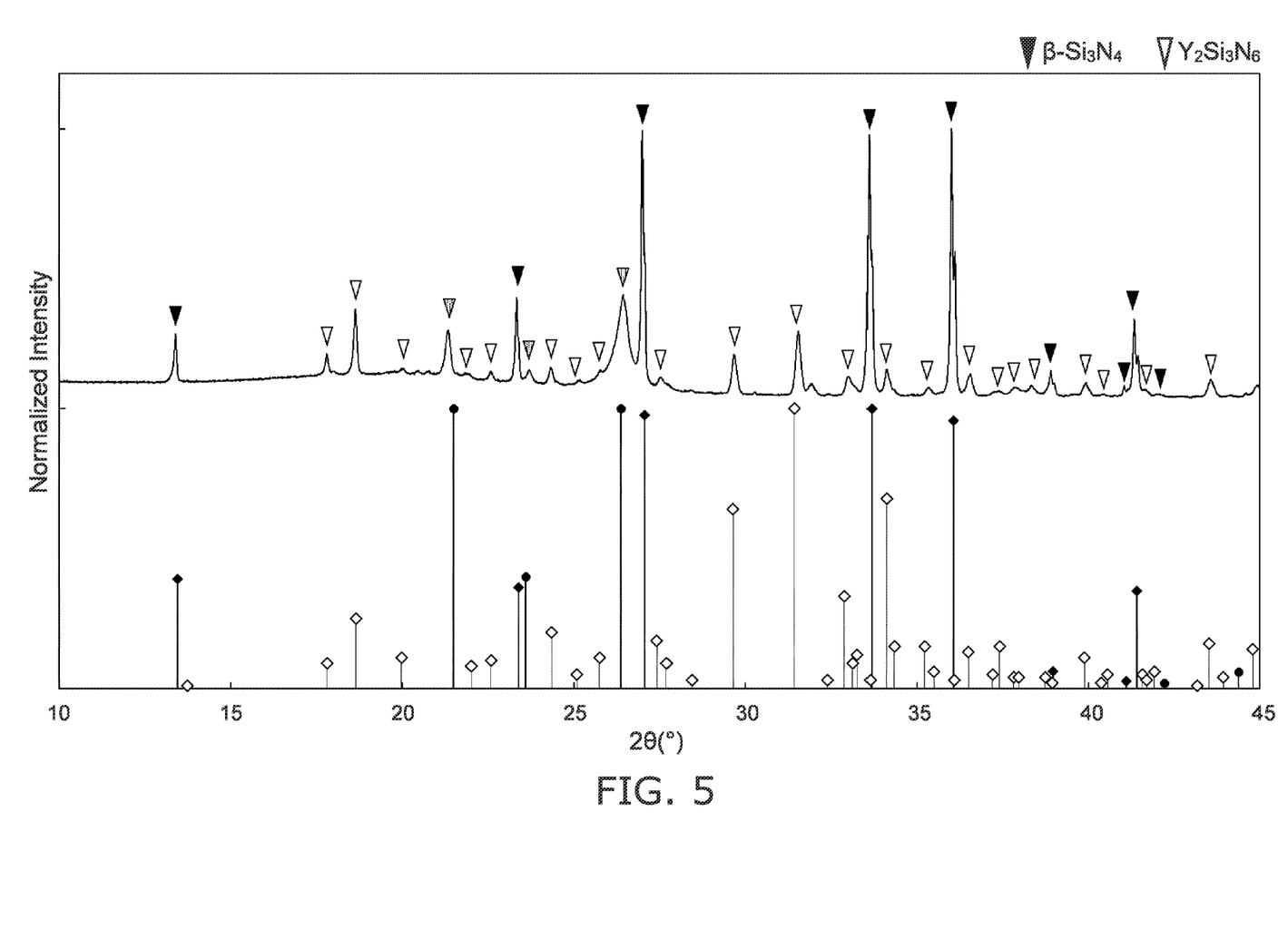
FIG. 5 is a graph illustrating analysis results of a structure according to a reference example.

FIG. 3 to FIG. 5 are graphs illustrating analysis results of structures according to reference examples.

FIG. 3 to FIG. 5 illustrate X-ray diffraction patterns according to the θ-2θ method of the structures according to the reference examples. Each of the horizontal axes represents 2θ. Each of the vertical axes represents a normalized intensity. The upper graph in each of FIG. 3 to FIG. 5 illustrates the analysis results for samples. The lower graph in each of FIG. 3 to FIG. 5 (right of the page) illustrates the X-ray diffraction patterns according to the θ-2θ method.

In the analysis results illustrated in FIG. 3, a peak pointed with a black triangular arrow (▼) is attributed to a crystal of β type silicon nitride. A peak pointed with a white triangular arrow (▽) is attributed to a crystal of $Y_4Si_2O_7N_2$. A peak pointed with a triangular arrow with dots is attributed to a jig used in the measurement.

The lower graph (right of the page) in FIG. 3 illustrates diffraction patterns of β type silicon nitride (β-$Si_3N_4$ type crystal phase), a $Y_4Si_2O_7N_2$ type crystal phase, and a material of the jig. A line with a black diamond shape (◆) indicates an angle at which a peak of β-type silicon nitride appears. A line with a white diamond shape (◇) indicates an angle at which a peak of $Y_4Si_3O_3N_4$ appears. A line with a black circle (●) indicates an angle at which a peak attributed to the jig appears.

In the structure according to the embodiment, the $Y_2Si_3O_3N_4$ type crystal phase is detected in addition to the β type silicon nitride (β-$Si_3N_4$) type crystal phase. In contrast, in a structure according to a first reference example, no $Y_2Si_3O_3N_4$ type crystal phase is detected, and as illustrated in FIG. 3, a $Y_4Si_2O_7N_2$ type crystal phase is detected.

In the analysis results illustrated in FIG. 4, a peak pointed with a black triangular arrow (▼) is attributed to the β type silicon nitride type crystal phase. A peak pointed with a white triangular arrow (▽) is attributed to an α type silicon nitride (α-$Si_3N_4$) type crystal phase. A peak pointed with a triangular arrow with dots is attributed to the material of the jig.

The lower graph (right of the page) in FIG. 4 illustrates a diffraction pattern of the β type silicon nitride (β-$Si_3N_4$) type crystal phase, a diffraction pattern of the α type silicon nitride (α-$Si_3N_4$) type crystal phase, and a diffraction pattern of the material of the jig. A line with a black diamond shape (♦) indicates an angle at which a peak of the β type silicon nitride type crystal phase appears. A line with a white diamond shape (◇) indicates an angle at which a peak of the α type silicon nitride type crystal phase appears. A line with a black circle (●) illustrates an angle at which a peak attributed to the material of the jig appears.

In a structure according to a second reference example, as illustrated in FIG. 4, a peak attributed to a compound including yttrium does not appear. In addition, the peaks attributed to the α type silicon nitride type crystal phase appear.

In the analysis results illustrated in FIG. 5, a peak pointed with a black triangular arrow (▼) is attributed to the β type silicon nitride type crystal phase. A peak pointed with a white triangular arrow (▽) is attributed to a $Y_2Si_3N_6$ type crystal phase. A peak pointed with a triangular arrow with dots is attributed to a material of a jig.

The lower graph (right of the page) in FIG. 5 illustrates a diffraction pattern of the β type silicon nitride (β-$Si_3N_4$) type crystal phase, a diffraction pattern of the $Y_2Si_3N_6$ type crystal phase, and a diffraction pattern of the material of the jig. A line with a black diamond shape (♦) indicates an angle at which a peak of the β type silicon nitride type crystal phase appears. A line with a white diamond shape (◇) indicates an angle at which a peak of the $Y_2Si_3N_6$ type crystal phase appears. A line with a black circle (●) illustrates an angle at which a peak attributed to the material of the jig appears.

In a structure according to a third reference example, no $Y_2Si_3O_3N_4$ type crystal phase is detected, and as illustrated in FIG. 5, a $Y_2Si_3N_6$ type crystal phase is detected.

The structure according to the first reference example illustrated in FIG. 3 is manufactured using powder of $Si_3N_4$ instead of powder of Si. That is, $Si_3N_4$, $Y_2O_3$, and MgO are ground and mixed. The mixture is dried and granulated by adding a binder. By degreasing after molding and further sintering, the structure according to the first reference example is obtained.

The structure according to the second reference example illustrated in FIG. 4 and the structure according to the third reference example illustrated in FIG. 5 are manufactured using powder of Si, similarly to the structure according to the embodiment. After grinding and mixing Si, $Y_2O_3$, and MgO, molding is performed without adding a binder. By degreasing after the molding and further sintering, the structures according to the second reference example and the third reference example are obtained. Between the structures according to the second reference example and the structure according to the third reference example, conditions of mixing raw materials in a planetary ball mill are different.

Thermal conductivity and flexural strength of each of the structures according to the embodiment and the respective reference examples are measured. The thermal conductivity is measured in accordance with JIS-R-1611. JIS-R-1611 corresponds to ISO18755 (2005). The thermal conductivity is measured by a laser flash method by using a flash analyzer LFA 467 HyperFlash manufactured by NETZSCH Holding.

The flexural strength is measured by a three-point flexural strength test in accordance with JIS-R-1601. JIS-R-1601 corresponds to ISO14704 (2000). An autograph AG-X (100 kN) manufactured by Shimadzu Corporation is used for the three-point flexural strength test. A load cell is set to 1 kN, a test speed is set to 0.5 mm/min, both an indenter radius and a support base radius are set to R2, a distance between fulcrums is set to 30 mm, and the three-point flexural strength test is performed at room temperature.

The thermal conductivities of the samples 1 to 3 illustrated in FIG. 2 are 120 W/(m·K), 121 W/(m·), 123 W/(m·K), respectively. According to the embodiment, the thermal conductivity of any of the structures is not lower than 120 W/(m·K). The thermal conductivity of the structure according to the first reference example is 86 W/(m·K). The thermal conductivity of the structure according to the second reference example is 70 W/(m·K). The thermal conductivity of the structure according to the third reference example is 127 W/(m·K).

The flexural strength of the structure according to the embodiment is 350 MPa. The flexural strength of the structure according to the first reference example is 800 MPa. The flexural strength of the structure according to the second reference example is 100 MPa. The flexural strength of the structure according to the third reference example is 200 MPa.

As described above, the thermal conductivity of the structure according to the embodiment is higher than the thermal conductivity of the structure according to the first reference example or the second reference example. The thermal conductivity of the structure according to the third reference example is equivalent to the thermal conductivity of the structure according to the embodiment. However, the flexural strength of the structure according to the third reference example is inferior to the flexural strength of the structure according to the embodiment.

Furthermore, the flexural strength of the structure according to the embodiment is higher than the thermal conductivity of the structure according to the second reference example or the third reference example. The flexural strength of the structure according to the first reference example is higher than the flexural strength of the structure according to the embodiment. However, the thermal conductivity of the structure according to the first reference example is inferior to the thermal conductivity of the structure according to the embodiment.

That is, the structure according to the embodiment has excellent thermal conductivity and flexural strength. For example, according to the embodiment, the thermal conductivity of the structure may be not lower than 100 (m·K) and the flexural strength may be not lower than 300 MPa.

As illustrated in FIG. 2, in the structure according to the embodiment, the β type silicon nitride type crystal phase and the $Y_2Si_3O_3N_4$ type crystal phase are included. On the other hand, in the structures according to the first reference example to the third reference example, the α type silicon nitride type crystal phase, the $Y_4Si_2O_7N_2$ type crystal phase, or the $Y_2Si_3N_6$ type crystal phase is included. In the structures according to the first reference example to the third reference example, the $Y_2Si_3O_3N_4$ type crystal phase is not included. Therefore, it is considered that improvement of properties due to the embodiment is attributed to the structure including the β type silicon nitride type crystal phase and the $Y_2Si_3O_3N_4$ type crystal phase. For example, as illustrated in FIG. 2, with the structure according to the embodiment, a ratio of the second peak intensity with respect to the first peak intensity is not lower than 0.005 and not higher than 0.20. In other words, the ratio is 0.005 or more and 0.20 or less. It is considered that including the $Y_2Si_3O_3N_4$ type crystal phase in the grain boundary in such a manner that the ratio is not lower than 0.005 improves properties of the structure.

The $Y_2Si_3O_3N_4$ type crystal phase has a ratio of the number of oxygen atoms with respect to the number of nitrogen atoms of about 0.75. The $Y_4Si_2O_7N_2$ type crystal phase has a ratio of the number of oxygen atoms with respect to the number of nitrogen atoms of about 3.5. The $Y_2Si_3N_6$ type crystal phase has a ratio of the number of oxygen atoms with respect to the number of nitrogen atoms of about 0. It is considered to be important that an oxygen concentration in the grain boundary of the structure is not too high or not too low to form the $Y_2Si_3O_3N_4$ type crystal phase. When oxygen is appropriately present in the grain boundary of the structure, excellent thermal conductivity and high flexural strength can be achieved. This is considered to be attributed to the excellent thermal conductivity and the high flexural strength of the $Y_2Si_3O_3N_4$ type crystal phase.

As for the structure according to the embodiment, granulation is performed by adding a binder to a mixture obtained by grinding in manufacturing. It is considered that addition of this process more evenly disperses oxygen in a process of manufacturing the structure and facilitates formation of the $Y_2Si_3O_3N_4$ type crystal phase. For example, it is considered that due to occurrence of a bias in the oxygen concentration, formation of the $Y_4Si_2O_7N_2$ type crystal phase and the $Y_2Si_3N_6$ type crystal phase in the grain boundary may be suppressed.

As described above, with the structure according to the embodiment, the ratio of the second peak intensity with respect to the first peak intensity is not lower than 0.005 and not higher than 0.20. Favorably, the ratio is not lower than 0.005 and not higher than 0.17. Preferably, the ratio is not lower than 0.005 and not higher than 0.14. By setting an amount of the $Y_2Si_3O_3N_4$ type crystal phase in the grain boundary within these optimal ranges, both of high thermal conductivity and high flexural strength can be achieved.

In the structure according to the embodiment, the ratio of the fourth peak intensity with respect to the third peak intensity is not lower than 0.00 and not higher than 0.20. Favorably, the ratio is not lower than 0.00 and not higher than 0.18. Preferably, the ratio is not lower than 0.00 and not higher than 0.15. By setting the amount of the $Y_2Si_3O_3N_4$ type crystal phase in the grain boundary within these optimal ranges, both of high thermal conductivity and high flexural strength can be achieved.

In the structure according to the embodiment, the ratio of the sixth peak intensity with respect to the fifth peak intensity is not lower than 0.00 and not higher than 0.20. Favorably, the ratio is not lower than 0.00 and not higher than 0.15. Preferably, the ratio is not lower than 0.00 and not higher than 0.10. By setting the amount of the $Y_2Si_3O_3N_4$ type crystal phase in the grain boundary within these optimal ranges, both of high thermal conductivity and high flexural strength can be achieved.

When these ratios are within the ranges described above, the thermal conductivity and the flexural strength of the structure can be improved.

As for the $Y_2Si_3O_3N_4$ type crystal phase, a full width at half maximum of each of the peaks P2, P4, and P6 illustrated in FIG. 2 is favorably 0.25° or less. Due to high crystallinity of the $Y_2Si_3O_3N_4$ type crystal phase in such a manner that the full width at half maximum is not larger than 0.25°, the thermal conductivity and the flexural strength of the structure can be further improved.

Figure 6A:
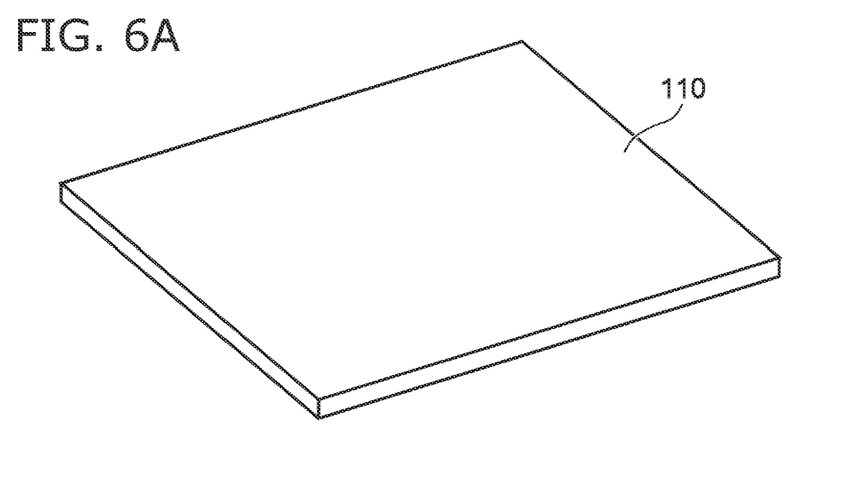
FIGS. 6A and 6B are perspective views illustrating the structure according to the embodiment.
Figure 6B:
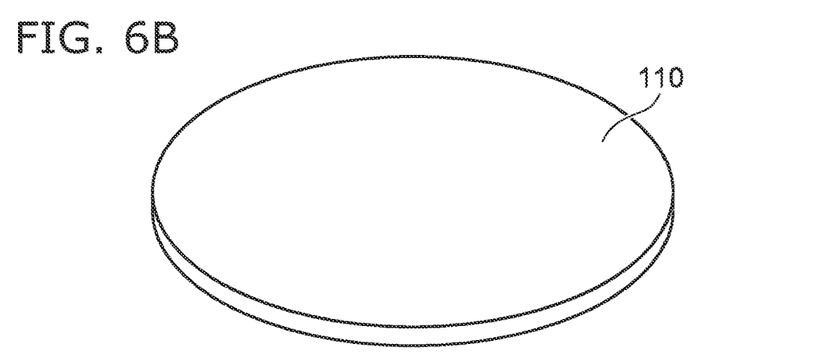

Each of FIGS. 6A and 6B is a perspective view illustrating the structure according to the embodiment.

For example, as illustrated in FIGS. 6A and 6B, the structure according to the embodiment is a substrate. A shape of the substrate is arbitrary. As described above, the structure according to the embodiment has high thermal conductivity and high flexural strength. Thus, the structure according to the embodiment may be suitably used as the substrate. Alternatively, the structure according to the embodiment may be a bearing or the like.

Figure 7:
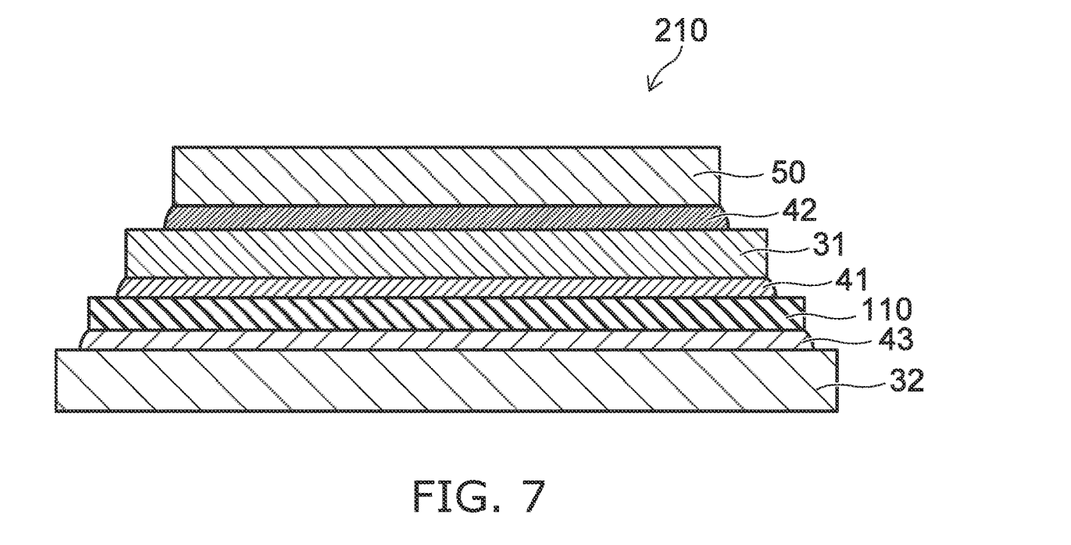
FIG. 7 is a schematic cross-sectional view illustrating a bonded body according to the embodiment.

FIG. 7 is a schematic cross-sectional view illustrating a bonded body according to the embodiment.

A bonded body 210 according to the embodiment includes a first metal part 31 and the structure 110, as illustrated in FIG. 7. In the example, the structure 110 is used as a substrate.

The first metal part 31 is bonded to the structure 110. For example, a bonding part 41 is provided between the first metal part 31 and the structure 110. The first metal part 31 may be directly bonded to the structure 110 without the bonding part 41 interposed between the first metal part 31 and the structure 110.

In the example illustrated in FIG. 7, the bonded body 210 further includes a second metal part 32 and a semiconductor device 50. The semiconductor device 50 is bonded to the first metal part 31. The first metal part 31 is positioned between the structure 110 and the semiconductor device 50. For example, the bonding part 42 is provided between the semiconductor device 50 and the first metal part 31. The semiconductor device 50 may be directly bonded to the first metal part 31 without the bonding part 42 interposed between the semiconductor device 50 and the first metal part 31.

The second metal part 32 is bonded to the structure 110. The structure 110 is positioned between the first metal part 31 and the second metal part 32. For example, a bonding part 43 is provided between the second metal part 32 and the structure 110. The second metal part 32 may be directly bonded to the structure 110 without the bonding part 43 between the second metal part 32 and the structure 110. The second metal part 32 functions as a heat sink, for example.

The first metal part 31 and the second metal part 32 include at least one selected from the group consisting of copper and aluminum, for example. The bonding parts 41 to 43 include at least one selected from the group consisting of silver and copper, for example. The bonding parts 41 to 43 may further include at least one selected from the group consisting of titanium, hafnium, zirconium, niobium, silicon, magnesium, indium, tin, and carbon. The semiconductor device 50 includes, for example, a diode, a MOSFET, or an IGBT.

The bonding parts 41 to 43 favorably include active metal. For example, when the first metal part 31 and the second metal part 32 include copper, the active metal is at least one selected from the group consisting of titanium, hafnium, zirconium, and niobium. The bonding parts 41 to 43 favorably include silver, copper and at least one selected from the group consisting of titanium, hafnium, zirconium, and niobium.

When the first metal part 31 and the second metal part 32 include aluminum, the active metal is at least one selected from the group consisting of silicon and magnesium. The bonding parts 41 to 43 favorably include silver, copper, and at least one selected from the group consisting of silicon and magnesium.

When the first metal part 31 and the second metal part 32 include copper, titanium is particularly preferable as the active metal. Titanium can be reacted with silicon nitride to form titanium nitride, thereby increasing bonding strength.

The use of the structure 110 according to the embodiment in the bonded body 210 can improve the thermal conductivity and the flexural strength of the bonded body 210. Furthermore, by using the structure 110 having excellent thermal conductivity in the substrate, it is possible to improve heat dissipation of the substrate, for example. In addition, the structure 110 has excellent flexural strength. Thus, it is possible to thin the substrate while maintaining the strength of the substrate. It is thereby possible, for example, to further improve the heat dissipation of the substrate.

According to the embodiment described above, the structure and the bonded body may be provided that can improve the thermal conductivity and the flexural strength.

Hereinabove, exemplary embodiments of the invention are described with reference to specific examples. However, the embodiments of the invention are not limited to these specific examples. For example, one skilled in the art may similarly practice the invention by appropriately selecting specific configurations of components such as structures, metal parts, bonding parts, semiconductor elements, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all structures, and bonded bodies practicable by an appropriate design modification by one skilled in the art based on the structures, and the bonded bodies described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A structure, comprising:
a crystal grain including a β type silicon nitride crystal phase; and
a grain boundary provided around the crystal grain, the grain boundary having a composition comprising yttrium, silicon, oxygen and nitrogen and the grain boundary consisting essentially of a $Y_2Si_3O_3N_4$ crystal phase, wherein
in an X-ray diffraction pattern in accordance with a θ-2θ method, a ratio of a second peak intensity being highest and appearing in 2θ=31.93±0.1° with respect to a first peak intensity being highest and appearing in 2θ=27.03±0.1° is 0.005 or more and 0.20 or less, wherein for measurement of the X-ray diffraction pattern, a tube voltage is set to 45 kV and a surface roughness Ra is 0.05 μm or less, and
the crystal grain is oval shaped.

2. The structure according to claim 1, wherein in the X-ray diffraction pattern, a ratio of a fourth peak intensity of a peak appearing in 2θ=29.67±0.1° with respect to a third peak intensity of a peak appearing in 2θ=33.63±0.1° is more than 0.00 and 0.20 or less,
wherein if more than one peak appears in the range 2θ=29.67±0.1°, the fourth peak is the peak of maximum intensity, and
if more than one peak appears in the range 2θ=33.63±0.1°, the third peak is the peak of maximum intensity.

3. The structure according to claim 1, wherein a ratio of the second peak intensity with respect to the first peak intensity is 0.005 or more and 0.17 or less.

4. The structure according to claim 2, wherein in the X-ray diffraction pattern, a ratio of a sixth peak intensity of a peak appearing in 2θ=38.36±0.1° with respect to a fifth peak intensity of a peak appearing in 2θ=36.04±0.1° is more than 0.00 and 0.20 or less,
wherein if more than one peak appears in the range 2θ=38.36±0.1°, the sixth peak is the peak of maximum intensity, and
if more than one peak appears in the range 2θ=36.04=0.1°, the fifth peak is the peak of maximum intensity.

5. The structure according to claim 1, wherein a full width at half maximum of the second peak intensity appearing in 2θ=31.93±0.1° is not smaller than 0.25°.

6. The structure according to claim 1, comprising a plurality of crystal grains, wherein the grain boundary is provided around the plurality of crystal grains.

7. The structure according to claim 1, having a flexural strength of 300 MPa or more,
wherein the flexural strength is measured by a three-point flexural strength test in accordance with JIS-R-1601 at room temperature.

8. A bonded body comprising:
a substrate having the structure according to claim 1; and
a first metal part bonded to the substrate.

9. The bonded body according to claim 8, wherein
the substrate and the first metal part are bonded with a first bonding part interposed between the substrate and the first metal part,
the first metal part includes copper, and
the first bonding part includes silver, copper, and at least one selected from the group consisting of titanium, hafnium, zirconium, niobium, silicon, magnesium, indium, tin, and carbon.

10. The bonded body according to claim 8, further comprising:
a second metal part bonded to the substrate, wherein
the substrate is positioned between the first metal part and the second metal part.

11. The bonded body according to claim 8, further comprising:
a semiconductor device bonded to the first metal part, wherein
the first metal part is positioned between the substrate and the semiconductor device.

12. The structure according to claim 1, wherein a thermal conductivity of the structure is 120 W/(m·K) or more.

13. The structure according to claim 1, wherein the crystal grain does not include $MgSiN_2$ crystal phase.

14. A structure, comprising:
a crystal grain including a β type silicon nitride crystal phase; and
a composition comprising yttrium, silicon, oxygen and nitrogen which consists essentially of a $Y_2Si_3O_3N_4$ crystal phase, wherein
in an X-ray diffraction pattern in accordance with a θ-2θ method, a ratio of a second peak intensity appearing in $2\theta=31.93\pm0.1°$ with respect to a first peak intensity appearing in $2\theta=27.03\pm0.1°$ is 0.005 or more and 0.20 or less, wherein
if more than one peak appears in the range $2\theta=31.93\pm0.1°$, the second peak is the peak of maximum intensity, and if more than one peak appears in the range $2\theta=27.03\pm0.1°$, the first peak is the peak of maximum intensity and the crystal grain is oval shaped.

15. The structure according to claim 14, wherein in the X-ray diffraction pattern, a ratio of a fourth peak intensity appearing in $2\theta=29.67\pm0.1°$ with respect to a third peak intensity appearing in $2\theta=33.63\pm0.1°$ is more than 0.00 and 0.20 or less, wherein if more than one peak appears in the range $2\theta=29.67\pm0.1°$, the fourth peak is the peak of maximum intensity, and if more than one peak appears in the range $2\theta=33.63\pm0.1°$, the third peak is the peak of maximum intensity.

16. The structure according to claim 15, wherein in the X-ray diffraction pattern, a ratio of a sixth peak intensity appearing in $2\theta=38.36\pm0.1°$ with respect to a fifth peak intensity appearing in $2\theta=36.04\pm0.1°$ is more than 0.00 and 0.20 or less, wherein if more than one peak appears in the range $2\theta=38.36\pm0.1°$, the sixth peak is the peak of maximum intensity, and if more than one peak appears in the range $2\theta=36.04\pm0.1°$, the fifth peak is the peak of maximum intensity.

17. The structure according to claim 14, comprising a plurality of crystal grains, wherein the composition comprising yttrium, silicon, oxygen and nitrogen is a grain boundary provided around the plurality of crystal grains.

18. The structure according to claim 1, wherein a thermal conductivity of the structure is from 100 to 127 W/(m·K).

19. The structure according to claim 18, wherein in the X-ray diffraction pattern, a ratio of a fourth peak intensity appearing in $2\theta=29.67\pm0.1°$ with respect to a third peak intensity appearing in $2\theta=33.63\pm0.1°$ is more than 0.00 and 0.20 or less, wherein if more than one peak appears in the range $2\theta=29.67\pm0.1°$, the fourth peak is the peak of maximum intensity, and if more than one peak appears in the range $2\theta=33.63\pm0.1°$, the third peak is the peak of maximum intensity.

20. The structure according to claim 18, wherein in the X-ray diffraction pattern, a ratio of a sixth peak intensity appearing in $2\theta=38.36\pm0.1°$ with respect to a fifth peak intensity appearing in $2\theta=36.04\pm0.1°$ is more than 0.00 and 0.20 or less, wherein if more than one peak appears in the range $2\theta=38.36\pm0.1°$, the sixth peak is the peak of maximum intensity, and if more than one peak appears in the range $2\theta=36.04\pm0.1°$, the fifth peak is the peak of maximum intensity.

* * * * *